(12) United States Patent
Hopper et al.

(10) Patent No.: US 7,897,472 B2
(45) Date of Patent: Mar. 1, 2011

(54) APPARATUS AND METHOD FOR WAFER LEVEL FABRICATION OF HIGH VALUE INDUCTORS ON SEMICONDUCTOR INTEGRATED CIRCUITS

(75) Inventors: Peter J. Hopper, San Jose, CA (US); Peter Johnson, Sunnyvale, CA (US); Kyuwoon Hwang, Palo Alto, CA (US); Andrei Papou, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 12/624,259

(22) Filed: Nov. 23, 2009

(65) Prior Publication Data

US 2010/0068864 A1 Mar. 18, 2010

Related U.S. Application Data

(62) Division of application No. 11/495,143, filed on Jul. 27, 2006, now Pat. No. 7,652,348.

(51) Int. Cl.
*H01L 21/20* (2006.01)
(52) U.S. Cl. .......... 438/381; 257/531; 257/E21.022
(58) Field of Classification Search .......... 257/531, 257/E21.022; 438/381; 336/200, 232
See application file for complete search history.

(56) References Cited

U.S. PATENT DOCUMENTS

| | | | |
|---|---|---|---|
| 5,204,809 A | 4/1993 | Andersen | |
| 5,355,301 A | 10/1994 | Saito et al. | |
| 5,541,135 A | 7/1996 | Pfeifer et al. | |
| 5,869,148 A | 2/1999 | Silverschotz et al. | |
| 6,166,422 A | 12/2000 | Qian et al. | |
| 6,249,039 B1 | 6/2001 | Harvey et al. | |
| 6,462,976 B1 | 10/2002 | Olejniczak et al. | |
| 6,867,903 B2 | 3/2005 | Imajuku et al. | |
| 6,940,147 B2 | 9/2005 | Crawford et al. | |
| 7,232,733 B2 | 6/2007 | Lotfi et al. | |
| 7,268,410 B1 | 9/2007 | Hopper et al. | |
| 2002/0097129 A1 | 7/2002 | Johnson | |
| 2003/0005569 A1 | 1/2003 | Hiatt et al. | |
| 2004/0263310 A1 | 12/2004 | Ding et al. | |
| 2008/0001699 A1* | 1/2008 | Gardner et al. | 336/200 |

OTHER PUBLICATIONS

Johnson et al., U.S. Appl. No. 11/274,932 entitled "Apparatus and Method for Fabricating High Value Inductors on Semiconductor Integrated Circuits" filed Nov. 14, 2005.
U.S. Appl. No. 10/658,433 entitled "High Density Integrated Inductor with Core" filed Sep. 8, 2003.
Hwang et al., U.S. Appl. No. 11/111,660, "Patterned Magnetic Layer On-Chip Inductor" filed Apr. 21, 2005.

(Continued)

*Primary Examiner* — Lex Malsawma
*Assistant Examiner* — Robert Huber
(74) *Attorney, Agent, or Firm* — Beyer Law Group LLP (57) ABSTRACT

Methods for forming multiple inductors on a semiconductor wafer are described. A plating layer and a photoresist layer are applied over a semiconductor wafer. Recess regions are etched in the photoresist layer using photolithographic techniques, which exposes portions of the underlying plating layer. Metal is electroplated into the recess regions in the photoresist layer to form multiple magnetic core inductor members. A dielectric insulating layer is applied over the magnetic core inductor members. Additional plating and photoresist layers are applied over the dielectric insulating layer. Recess regions are formed in the newly applied photoresist layer. Electroplating is used to form inductor windings in the recess regions. Optionally, a magnetic paste can be applied over the inductor coils.

21 Claims, 5 Drawing Sheets

OTHER PUBLICATIONS

Johnson et al., U.S. Appl. No. 11/137,767 entitled Method of Improving On-Chip Power Inductor Performance in DC-DC Regulators filed May 25, 2005.
U.S. Appl. No. 11/495,143, filed Jul. 27, 2006.
U.S. Appl. No. 11/504,972, filed Aug. 15, 2006.
"The Concise Colour Science Dictionary", Oxford University Press, 1997, p. 708.
Office Action from U.S. Appl. No. 11/495,143, dated Dec. 20, 2007.
Final Office Action from U.S. Appl. No. 11/495,143 dated May 29, 2008.
Office Action from U.S. Appl. No. 11/495,143 dated Aug. 15, 2008.
Office Action from U.S. Appl. No. 11/504,972 dated Nov. 26, 2008.
Office Action dated Apr. 23, 2009 in U.S. Appl. No. 11/495,143.
Final Office Action dated Jun. 23, 2009 in U.S. Appl. No. 11/504,972.
Office Action dated Nov. 20, 2009 in U.S. Appl. No. 11/504,972.
Final Office Action dated May 27, 2010 in U.S. Appl. No. 11/504,972.
Notice of Allowance dated Sep. 21, 2010 in U.S. Appl. No. 11/504,972.

* cited by examiner

APPARATUS AND METHOD FOR WAFER LEVEL FABRICATION OF HIGH VALUE INDUCTORS ON SEMICONDUCTOR INTEGRATED CIRCUITS

CROSS REFERENCE TO RELATED APPLICATION

This application is a divisional application claiming priority to U.S. patent application Ser. No. 11/495,143 filed on Jul. 27, 2006 and entitled "Apparatus and Method for Wafer Level Fabrication of High Value Inductors on Semiconductor Integrated Circuits," which is incorporated herein by reference in its entirety for all purposes.

BACKGROUND

1. Field of the Invention

The present invention relates to semiconductor integrated circuits, and more particularly, to an apparatus and method for wafer level fabrication of high value inductors directly on top of semiconductor integrated circuits.

2. Background of the Invention

Inductors are commonly used in the electronics industry for storing magnetic energy. An inductor is typically created by providing an electric current though a metal conductor, such as a metal plate or bar. The current passing though the metal conductor creates a magnet field or flux around the conductor. The amount of inductance is measured in terms of Henries. In the semiconductor industry, it is known to form inductors on integrated circuits. The inductors are typically created by fabricating what is commonly called an "air coil" inductor on the chip. The air coil inductor is usually either aluminum or some other metal patterned in a helical, toroidal or a "watch spring" coil shape. By applying a current through the inductor, the magnetic flux is created.

Inductors are used on chips for a number of applications. Perhaps the most common application is direct current to direct current or DC to DC switching regulators. In many situations, however, on chip inductors do not generate enough flux or energy for a particular application. When this occurs, very often an off-chip discrete inductor is used.

There are a number of problems in using off-chip inductors. Foremost, they tend to be expensive. With advances in semiconductor process technology, millions upon millions of transistors can be fabricated onto a single chip. With all these transistors, designers have been able to cram a tremendous amount of functionality onto a single chip and an entire system on just one or a handful of chips. Providing an off-chip inductor can therefore be relatively expensive. Off-chip inductors can also be problematic in situations where space is at a premium. In a cell phone or personal digital assistant (PDA) for example, it may be difficult to squeeze a discrete inductor into a compact package. As a result, the consumer product may not be as small or compact as desired.

An apparatus and method for wafer level fabrication of high value inductors directly on top of semiconductor integrated circuits is therefore needed.

SUMMARY OF THE INVENTION

Methods for forming multiple inductors on a semiconductor wafer are described. In one embodiment, a plating layer and a photoresist layer are applied over a semiconductor wafer. Recess regions are etched in the photoresist layer using photolithographic techniques, which exposes portions of the underlying plating layer. Metal is electroplated into the recess regions in the photoresist layer to form multiple magnetic core inductor members. A dielectric insulating layer is applied over the magnetic core inductor members. Additional plating and photoresist layers are applied over the dielectric insulating layer. Recess regions are formed in the newly applied photoresist layer. Metal is electroplated into the recess regions to form inductor coils. Optionally, a magnetic paste can be applied over the inductor coils. In another embodiment, one or more inductors are formed on an integrated circuit.

BRIEF DESCRIPTION OF THE DRAWINGS

Like elements are designated by like reference numbers in the Figures.

DETAILED DESCRIPTION OF THE PREFERRED EMBODIMENTS

Figure 1:
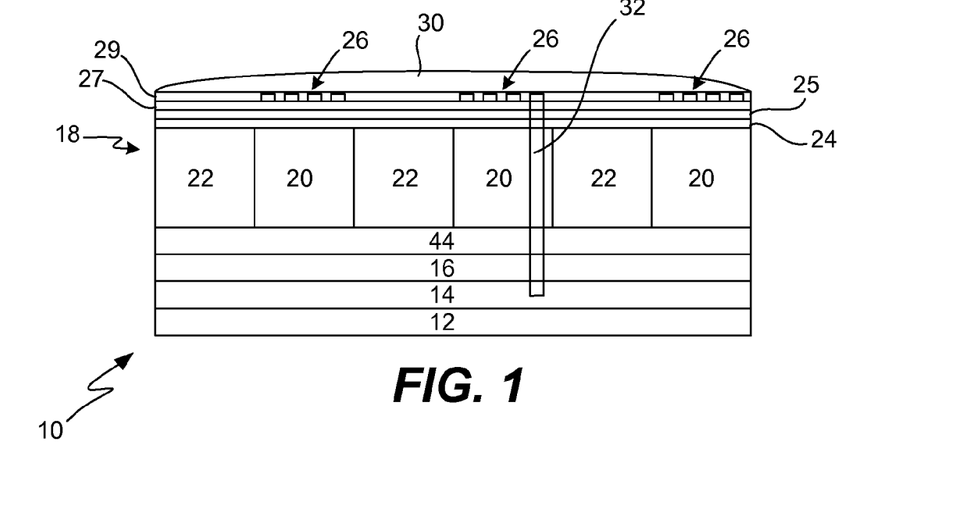
FIG. 1 is a cross section of a semiconductor integrated circuit die with power circuitry fabricated and an inductor fabricated thereon according to the present invention.

Referring to FIG. 1, a cross section of a semiconductor integrated circuit die with power circuitry and an inductor fabricated directly thereon according to the present invention is shown. The die 10 includes a silicon substrate 12 with power circuitry fabricated thereon in accordance with well known semiconductor manufacturing techniques (for the sake of simplicity, the circuitry is not visible in the figure), metal interconnect layer(s) 14 including one or more levels of metal interconnect, and an interconnect dielectric layer 16 formed over the metal interconnect layers 14. An inductor 18 is fabricated directly on a plating layer 44 formed over the interconnect dielectric layer 16. The inductor 18 includes a plurality of magnetic core inductor members 20 provided between resists spacers 22, a planarization surface 24 formed over the inductor members 20 and spacers 22, an insulating layer 25, a plating layer 27, an inductor coil 26 formed within another resist layer 29, and a magnetic paste 30 formed over the inductor coil 26. An electrical contact 32 is provided between the coil 26 and a switching node (not shown) provided in one of the metal layers of interconnect 14.

The present invention is directed to the wafer level fabrication of the inductor 18 directly onto the die 10 in wafer form. FIGS. 2 and 3A through 3E illustrate the fabrication sequence.

Figure 2:
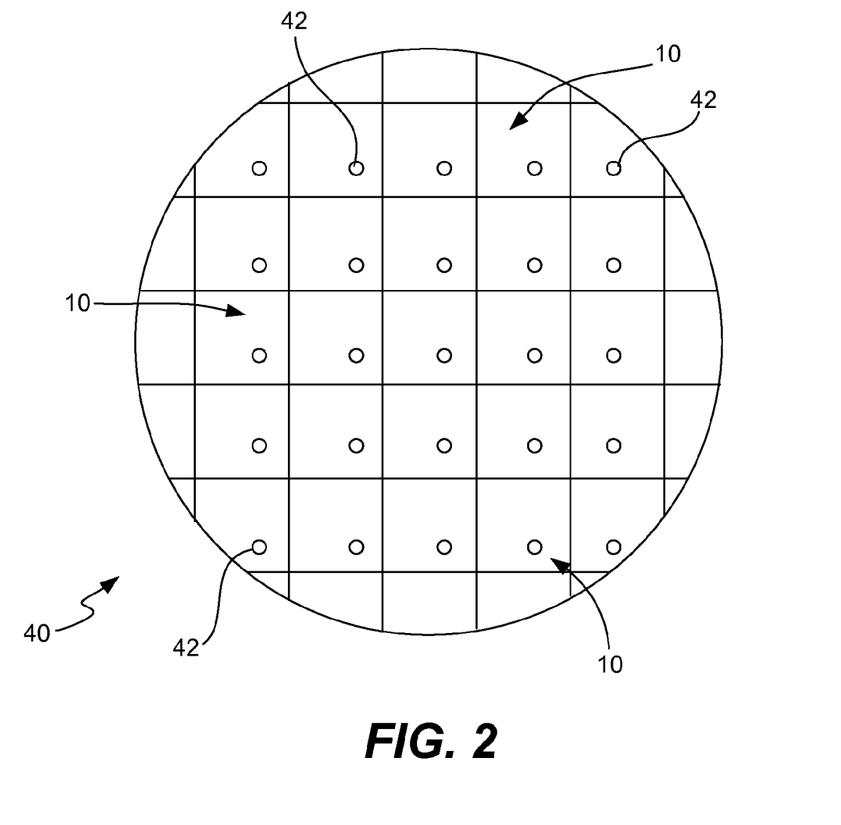
FIG. 2 is a semiconductor wafer including a plurality of dice with power circuitry fabricated thereon according to the present invention.

Referring to FIG. 2, a semiconductor wafer 40 including a plurality of dice 10 is shown. Each die 10 includes power regulation circuitry fabricated thereon, including a switching node 42. For the sake of simplicity, the power regulation circuitry is not shown or described herein. The switching node 42 is typically a metal contact of one of the metal interconnect layers 14. The switching node 42 is in electrical contact with the underlying transistors forming the power regulation circuitry on the device. In the subsequent discussion with regard to FIGS. 3A through 3E, the wafer level fabrication process for forming the inductor 18 on top of the die 10 is described in detail.

Figure 3A:
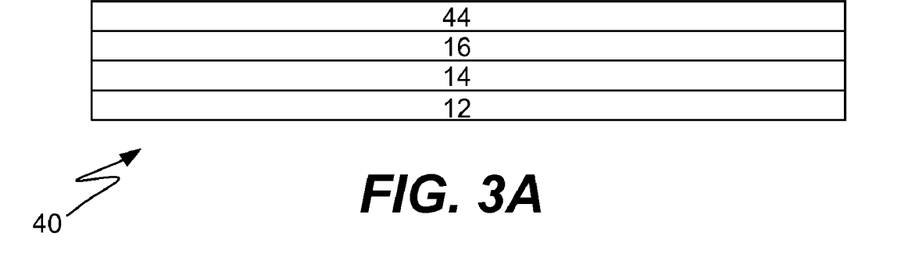
FIGS. 3A through 3E are a series of cross sections illustrating the fabrication of the inductors fabricated on the wafer according to the present invention.

Referring to FIG. 3A, a cross section of the wafer 40 is shown. The wafer includes the silicon substrate 12 having the power regulation circuitry fabricated thereon, metal interconnect layers 14, and the interconnect dielectric layer 16 formed over the metal layers 14. The fabrication of the design and fabrication of the power circuitry and metal interconnect levels 14 are well known and therefore are not described in detail herein.

The initial step in the fabrication of the inductor 18 involves the forming of a plating layer 44 across the top surface of the wafer 40. The plating layer 44 actually includes three layers, including an underlying oxide protection layer, a middle seed layer, and an upper adhesion layer. In one embodiment, the plating layer 44 is formed by sputtering 300 Angstroms of titanium, 3000 Angstroms of copper, and 300 Angstroms of titanium on the wafer surface to form the protection, seed, and adhesion layers respectively. It should be noted that specific embodiment disclosed herein in merely exemplary, and that a plating layer 44 can be formed using any one of a number of well known techniques and materials and the invention should not be construed as limited to the metals and thicknesses disclosed herein.

Figure 3B:
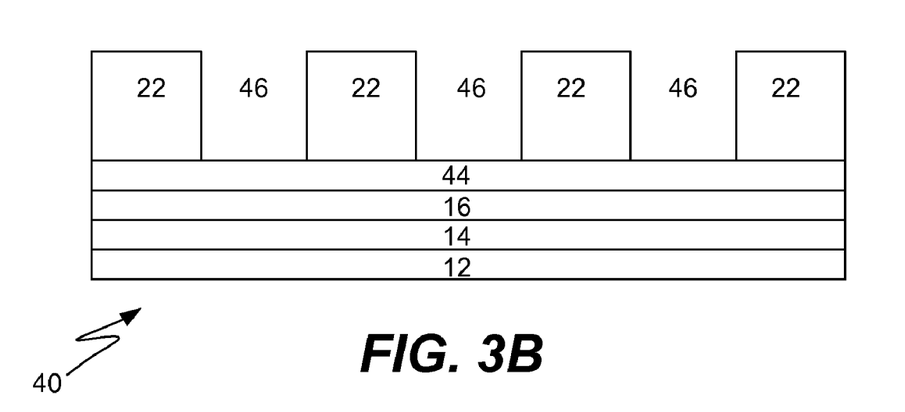

In the next step as illustrated in FIG. 3B, the photo resist layer 22 is formed over the plating layer 44. In various embodiments, the photo resist layer 22 can be a spin-on BCB or SU8 layer approximately 30 microns thick. Once the resist layer 22 is formed, it is patterned to form a set of recess regions 46 that expose the underlying plating layer 44. The recess regions 44 are formed using well known photolithography techniques including masking, exposing and etching of the resist layer 22. The recess regions 46 form what are in essence "molds" which will be later used to form the magnetic core inductor members 22.

Figure 3C:
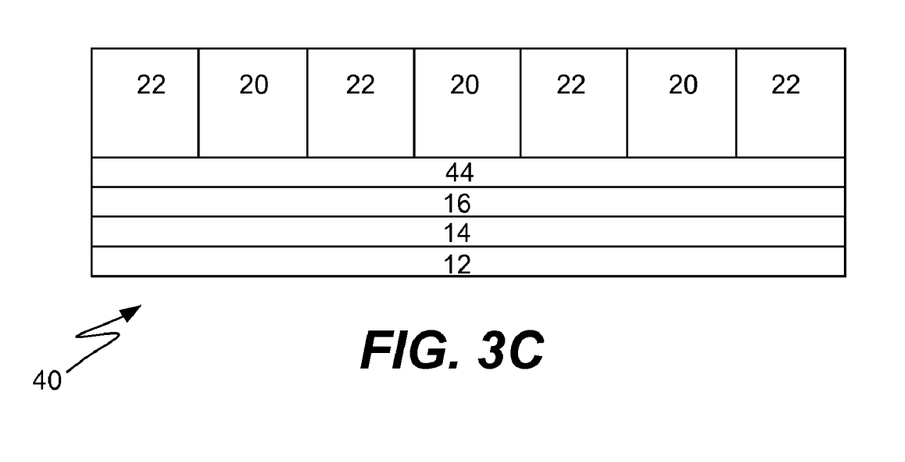

As illustrated in FIG. 3C, the magnetic core inductor members 20 are formed within the molds or recess regions 46 by electroplating. The upper adhesion layer of titanium is stripped away, exposing the underlying copper seed layer of the plating layer 44. A negative bias or voltage is then applied to the wafer 40 while submerged in a NiFe plating bath. During the plating, the recess regions 46 are filed with NiFe, forming the magnetic core inductor members 20. The recess regions 46 thus define the shape and location of the inductor members 20 on each die on the wafer 30.

Figure 3D:
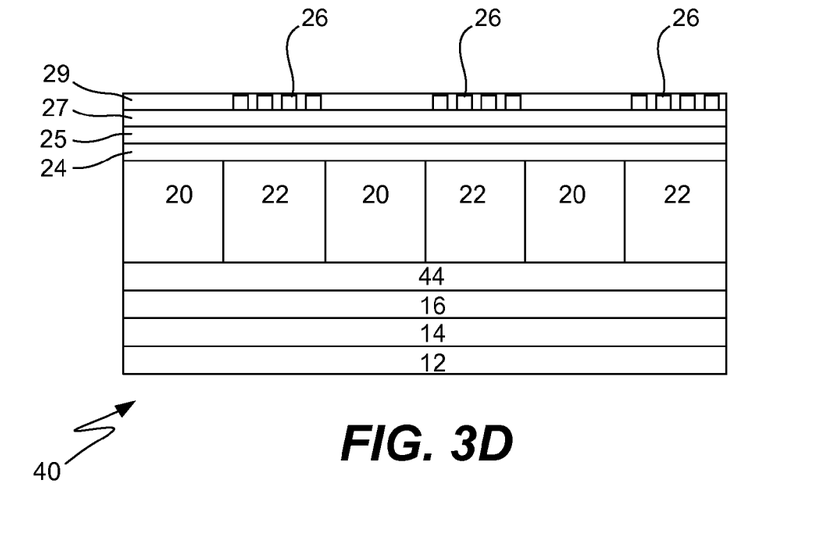

A illustrated in FIG. 3D, the inductor coils 26 are next formed on the wafer surface. After the inductor members 20 are formed, the planarization layer 24 is created across the top surface of the wafer. In one embodiment, the planarization layer 24 is a spin-on layer such as BCB or SU8. Once the layer is formed, it is planarized or smoothed using chemical mechanical polishing (CMP), as is well known in the semiconductor fabrication art. A dielectric insulating layer 25 is next formed across the wafer surface. In various embodiments, the insulating layer 25 is formed by performing a plasma enhanced chemical vapor deposit of a material such as oxide, spinning on a polymer such as BCB or SU8, or a chemical vapor deposition of a polymer such as Paralyne.

The inductor coils 26 are formed is a manner similar to that described above with regard to the inductor members 20. Specifically, another plating layer 27 including an underlying oxide protection layer, a middle seed layer, and an upper adhesion layer, is formed across the wafer surface. Thereafter, a photo resist layer 29 is formed and patterned, forming recess regions which expose the top adhesive of the plating layer 27. The top adhesion layer is then stripped away, and the wafer 40 undergoes a plating operation in a copper bath. The inductor coils 26 are formed by the plating of copper in the bath onto the exposed seed layer within the recess regions. For the sake of brevity, the aforementioned steps are not illustrated in detail in the figure. The process, however, is essentially the same as that described above, and is therefore not repeated herein.

In the next step, the electrical contacts 32 are provided between the coils 26 and the underlying switching nodes (not shown) provided one of the metal layers of interconnect 14. The electrical contacts are formed by etching vias into the top surface of the wafer down to the switching node contact of each die 10. The vias are then filled with an electrically conductive material such as aluminum or copper. For the sake of simplicity, only one electrical contact 32 is illustrated in the Figures.

Figure 3E:
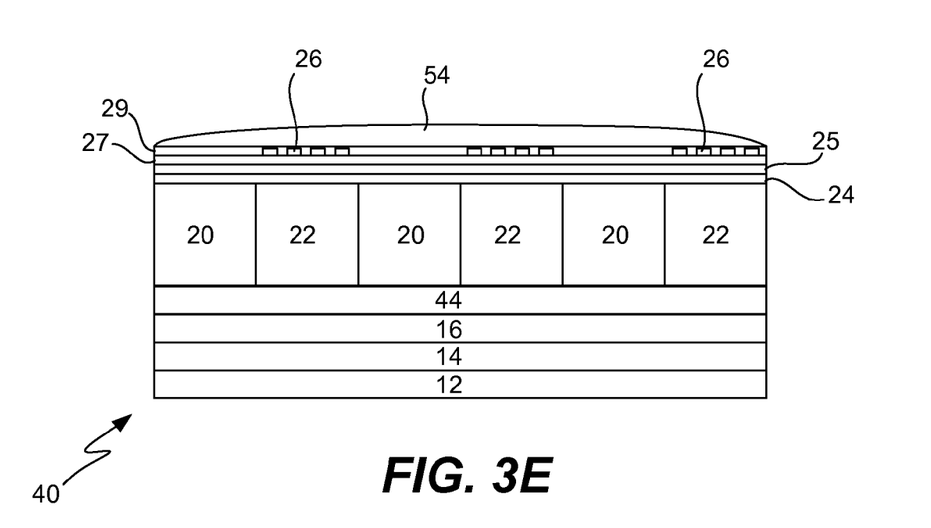

In the final step, as illustrated in FIG. 3E, a "blob" of magnetic paste 30 is extruded over the top surface of the wafer 40. The magnetic paste 30, according to various embodiments, can be either a non-conductive epoxy or a polymer filled with magnetic particles. An example of the type of magnetic particles could be MnZn ferrite, although many other types of magnetic particles could be used. In another specific embodiment, the particles are of various sizes ranging from 1 to 10 microns. The size variation is useful in increasing the fill factor of the magnetic particles. In one embodiment, the fill factor is between 80 to 90 percent.

Figure 4A:
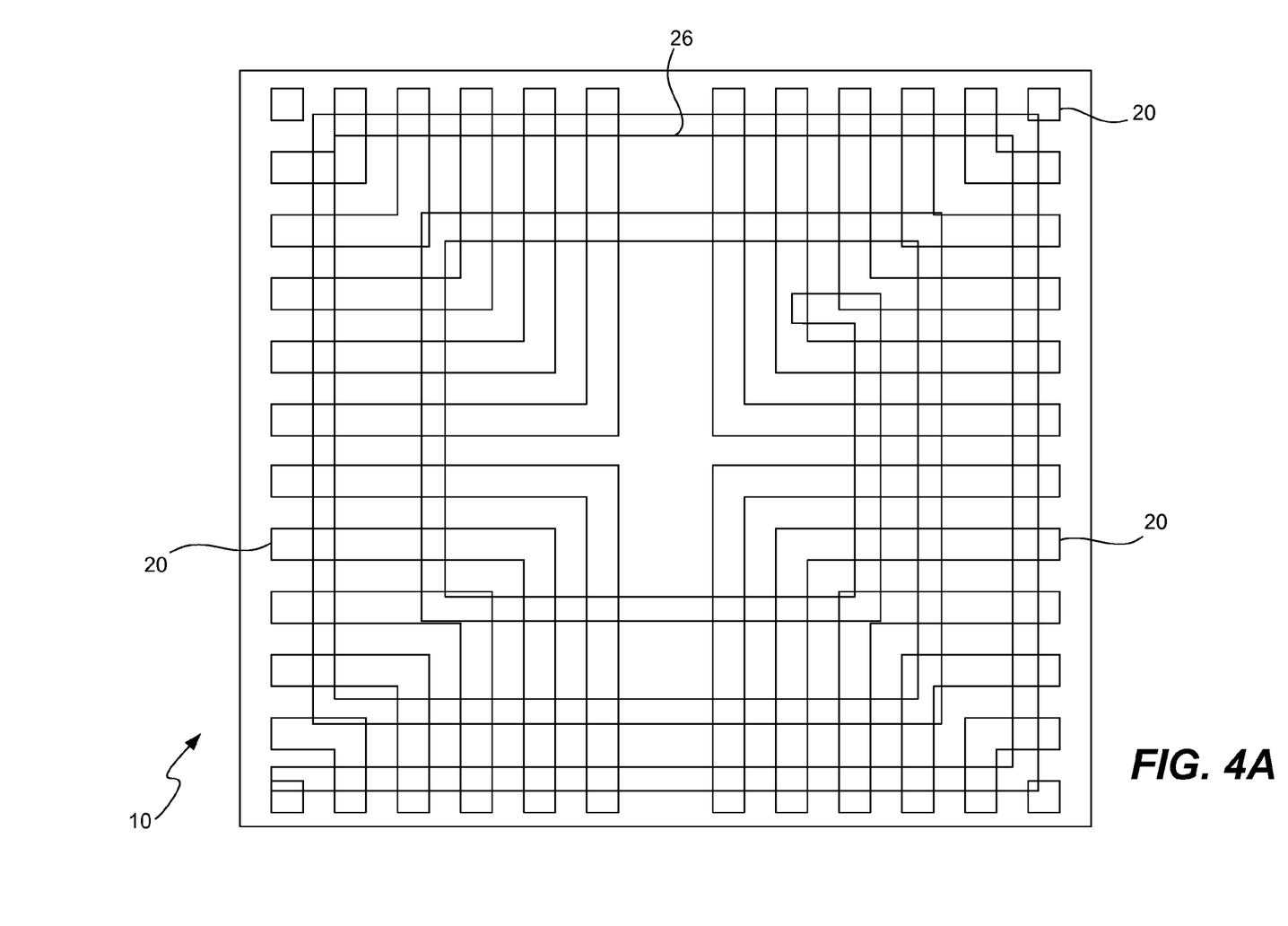
FIGS. 4A and 4B illustrate various pattern arrangements of magnetic core inductors and inductor coils of the inductors fabricated onto the wafer according to the present invention.
Figure 4B:
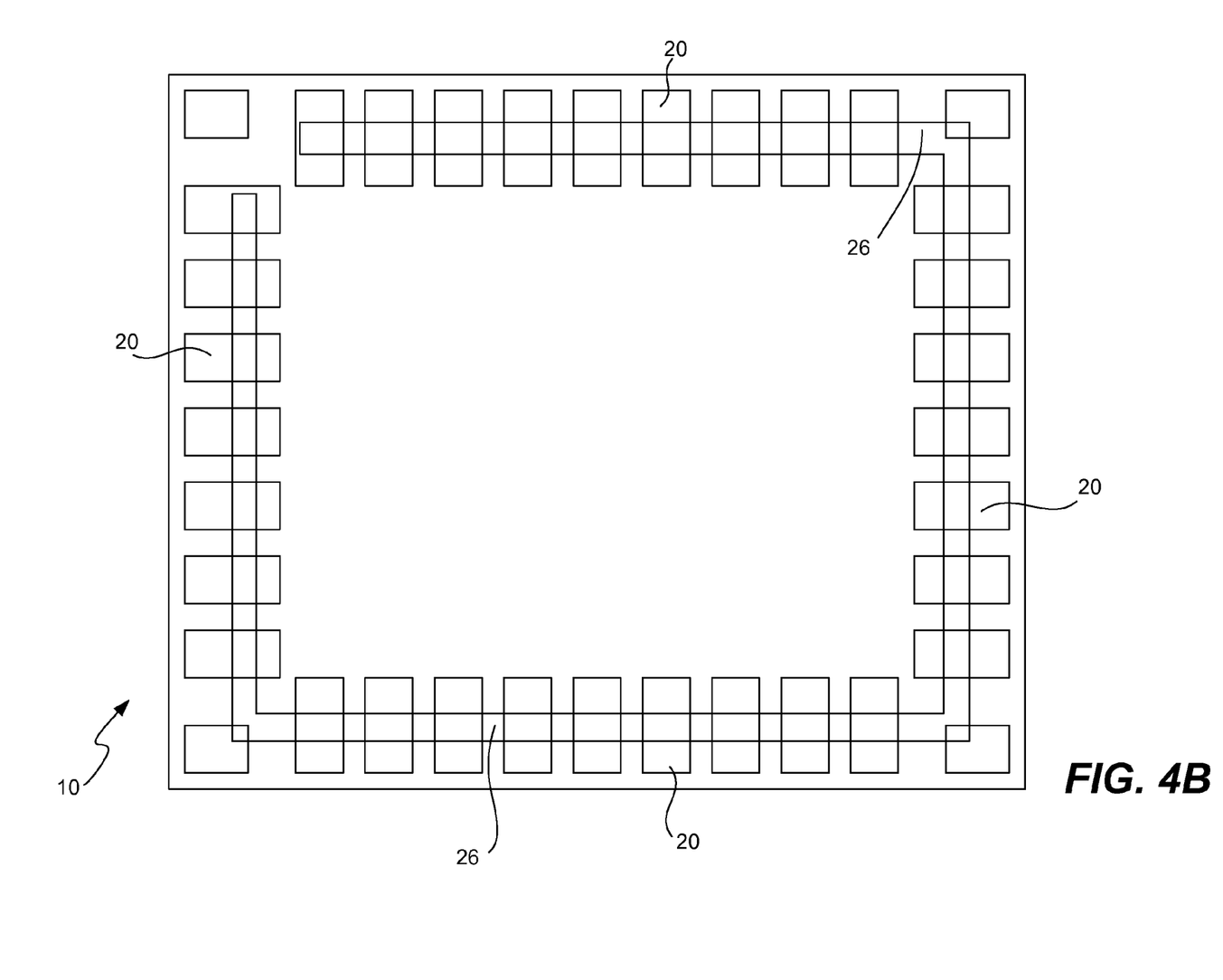

FIGS. 4A and 4B illustrate various pattern arrangements of magnetic core inductors 20 and inductor coils 26 of the inductors fabricated onto the wafer according to the present invention. It should be noted that these two embodiments are exemplary and in no way should they be construed as limiting. In FIG. 4A, the magnetic core inductors 20 are arranged in a chevron pattern in the four corners of the die 10 while the coil 26 is a multi-turn coil formed thereon. In FIG. 4b, the magnetic core inductors 20 are positioned around the periphery of the die 10, which the coil 26 makes a single turn. In each example, the magnetic core inductor members 20 are laminations perpendicular to the direction of current flow through the inductor coil 26.

In accordance with the present invention, the layout of the inductors 20 and coils 26 is arbitrary and can be done in any desirable manner. It should be made clear that the patterns shown in FIGS. 4A and 4B are arbitrary and should not be construed as limiting the invention.

While this invention has been described in terms of several preferred embodiments, there are alteration, permutations, and equivalents, which fall within the scope of this invention. It should also be noted that there are many alternative ways of implementing the methods and apparatuses of the present invention. For example, the steps of the present invention may be used to form a plurality of high value inductors 10 across many die on a semiconductor wafer. It is therefore intended that the following appended claims be interpreted as including all such alterations, permutations, and equivalents as fall within the true spirit and scope of the present invention.

What is claimed is:

1. A method for forming inductors on a semiconductor wafer comprising:

applying a first plating layer over a semiconductor wafer that includes a plurality of integrated circuit dice, wherein the first plating layer includes a seed layer covered by an adhesion layer;

applying a first photoresist layer over the first plating layer;

etching a first set of one or more recess regions in the first photoresist layer using photolithographic techniques to expose portions of the underlying first plating layer;

electroplating metal into the first set of recess regions in the first photoresist layer to form a plurality of magnetic core inductor members, wherein the electroplating of the metal into the first set of recess regions includes stripping away the adhesion layer to expose portions of the seed layer, applying electrical voltage to the semiconductor wafer and plating metal onto the exposed portions of the seed layer;

applying a dielectric insulating layer over the plurality of magnetic core inductor members;

applying a second plating layer over the dielectric insulating layer;

applying a second photoresist layer over the second plating layer;

etching a second set of one or more recess regions in the second photoresist layer using photolithographic techniques to expose portions of the underlying second plating layer;

electroplating metal into the second set of recess regions to form a plurality of inductor coils; and applying magnetic paste over the plurality of inductor coils wherein the forming of the magnetic core inductor members, the inductor coils and the application of the magnetic paste over the semiconductor wafer forms one or more inductors on each die of the semiconductor wafer.

2. The method of claim 1, wherein:
the first plating layer is applied directly to a top surface of the semiconductor wafer before any photoresist layer is applied on the top surface of the semiconductor wafer.

3. The method of claim 1, further comprising:
after forming the plurality of magnetic core inductor members and before applying a second plating layer, applying a planarization layer over the magnetic core inductor members.

4. The method of claim 3, wherein the applying of the planarization layer includes spinning on a polymer selected from at least one of a group consisting of BCB and SU8 to form the planarization layer.

5. The method of claim 1, wherein each die includes a metal interconnect layer with a switching node contact and an interconnect dielectric layer that covers the metal interconnect layer and wherein the method further comprises:
after forming the plurality of inductor coils, etching an opening in the die that exposes the switching node contact in the metal interconnect layer of the die; and
filling the opening with an electrically conductive material to form a conductive via such that the conductive via electrically connects at least one inductor coil on each die with the switching node contact of the die.

6. The method of claim 1, further comprising:
fabricating the semiconductor wafer such that each die of the semiconductor wafer includes power circuitry; and
fabricating a plurality of inductors directly onto the plurality of dice on the wafer, each of the inductors in electrical contact with the power circuitry on each of the dice respectively.

7. The method of claim 6, wherein fabricating the semiconductor wafer further comprises forming a switching node contact in electrical connection with the power circuitry on each of the dice on the wafer respectively.

8. The method of claim 1, wherein forming the plurality of magnetic core inductor members further comprises forming a plurality of rectangular shaped members of NiFe.

9. The method of claim 8, wherein applying the first plating layer further comprises:
forming an oxide protection layer over the semiconductor wafer, wherein the seed layer is formed over the oxide protection layer and the adhesion layer is formed over the seed layer.

10. The method of claim 9, further comprising:
sputtering titanium to form the oxide protection layer;
sputtering copper over the titanium layer to form the seed layer; and
sputtering a second titanium layer over the copper layer to form the adhesion layer.

11. The method of claim 10, wherein the first photoresist layer is applied over the second titanium layer and the method further comprises:
patterning the first photoresist layer to form rectangular shaped molds in the photoresist layer; and
filling the molds with NiFe to form the plurality of rectangular shaped members.

12. The method of claim 11, wherein filling the molds further comprises:
stripping the second titanium layer within the molds;
applying a negative potential to the wafer; and
electroplating the wafer in a NiFe electroplating bath.

13. The method of claim 1, wherein the applying of the dielectric insulating layer involves one of a group consisting of:
a plasma enhanced chemical vapor deposition;
spinning on of a polymer; and
chemical vapor deposition of a polymer.

14. A method for forming inductors on a semiconductor wafer comprising:
applying a first plating layer over a semiconductor wafer that includes a plurality of integrated circuit dice;
applying a first photoresist layer over the first plating layer;
etching a first set of one or more recess regions in the first photoresist layer using photolithographic techniques to expose portions of the underlying first plating layer;
electroplating metal into the first set of recess regions in the first photoresist layer to form a plurality of magnetic core inductor members;
applying a dielectric insulating layer over the plurality of magnetic core inductor members;
applying a second plating layer over the dielectric insulating layer, wherein applying the second plating layer includes forming adhesion, seed and oxide protection layers over the plurality of magnetic core inductor members;
applying a second photoresist layer over the second plating layer;
etching a second set of one or more recess regions in the second photoresist layer using photolithographic techniques to expose portions of the underlying second plating layer, wherein the etching of the second set of recess regions includes:
patterning the second photoresist layer to form a plurality of molds; and
removing the adhesion layer within the plurality of molds;
electroplating metal into the second set of recess regions to form a plurality of inductor coils, wherein the electroplating of the metal into the second set of recess regions includes filling the plurality of molds with copper; and
applying magnetic paste over the plurality of inductor coils wherein the forming of the magnetic core inductor members, the inductor coils and the application of the magnetic paste over the semiconductor wafer forms one or more inductors on each die of the semiconductor wafer.

15. The method of claim 14, wherein the molds are coil shaped.

16. The method of claim 14, further comprising electroplating the wafer in a copper bath to fill the plurality of molds with copper.

17. The method of claim 14, further comprising forming a plurality of electrical connections between the plurality of inductor coils and a plurality of switching node contacts on each of the dice of the wafer respectively.

18. A method for forming one or more inductors on an integrated circuit die, the method comprising:
- applying a first plating layer over an integrated circuit die;
- applying a first photoresist layer over the first plating layer, wherein the first plating layer includes a seed layer covered by an adhesion layer;
- etching a first set of one or more recess regions in the first photoresist layer using photolithographic techniques;
- electroplating metal into the first set of recess regions in the first photoresist layer to form a plurality of magnetic core inductor members, wherein the electroplating of the metal into the first set of recess regions includes stripping away the adhesion layer to expose portions of the seed layer, applying electrical voltage to the integrated circuit die and plating metal onto the exposed portions of the seed layer;
- applying a dielectric insulating layer over the plurality of magnetic core inductor members;
- applying a second plating layer over the dielectric insulating layer;
- applying a second photoresist layer over the second plating layer;
- etching a second set of one or more recess regions in the second photoresist layer using photolithographic techniques;
- electroplating metal into the second set of recess regions to form at least one inductor coil; and
- applying magnetic paste over the at least one inductor coil wherein the forming of the magnetic core inductor members, the at least one inductor coil and the application of the magnetic paste forms one or more inductors on the die.

19. The method of claim 18, wherein:
the first plating layer is applied directly to a top surface of the integrated circuit die before any photoresist layer is applied on the top surface of the integrated circuit die.

20. The method of claim 18, further comprising:
after forming the plurality of magnetic core inductor members and before applying a second plating layer, spinning on a polymer selected from at least one a group consisting of BCB and SU8 to form a planarization layer.

21. The method of claim 18, wherein the integrated circuit die includes an interconnect layer with a switching node contact and wherein the method further comprises:
- after forming the at least one inductor winding, etching an opening in the die that exposes the switching node contact; and
- filling the opening with an electrically conductive material to form a conductive via such that the conductive via electrically connects at least one inductor winding on each die with the switching node contact of the die.

* * * * *